United States Patent
Lim et al.

(10) Patent No.: US 6,376,376 B1
(45) Date of Patent: Apr. 23, 2002

(54) METHOD TO PREVENT CU DISHING DURING DAMASCENE FORMATION

(75) Inventors: Victor Seng Keong Lim, Singapore; Feng Chen, Palm Gardens; Wang Ling Goh, Nanyang Link, all of (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/760,165

(22) Filed: Jan. 16, 2001

(51) Int. Cl.$^7$ ............................................. H01L 21/44
(52) U.S. Cl. ..................... 438/687; 438/638; 438/643; 438/692
(58) Field of Search .................. 438/634, 637, 438/638, 639, 675, 643, 645, 687, 626, 691, 692, 627, 629

(56) References Cited

U.S. PATENT DOCUMENTS

| | | | |
|---|---|---|---|
| 5,356,513 A | 10/1994 | Burke et al. | 156/636 |
| 5,578,523 A | 11/1996 | Fiordalice et al. | 438/633 |
| 5,776,833 A | 7/1998 | Chen et al. | 438/672 |
| 5,798,302 A | 8/1998 | Hudson et al. | 438/693 |
| 5,854,140 A | 12/1998 | Jaso et al. | 438/740 |
| 5,886,410 A | 3/1999 | Chiang et al. | 257/759 |
| 6,001,730 A | 12/1999 | Farkas et al. | 438/627 |
| 6,004,188 A * | 12/1999 | Roy | 451/41 |
| 6,040,243 A * | 3/2000 | Li et al. | 438/687 |
| 6,048,796 A | 4/2000 | Wang et al. | 438/687 |
| 6,071,809 A | 6/2000 | Zhao | 438/634 |
| 6,096,632 A | 8/2000 | Drynan | 438/618 |
| 6,100,197 A | 8/2000 | Hasegawa | 438/687 |
| 6,150,269 A * | 11/2000 | Roy | 438/687 |
| 6,184,138 B1 * | 2/2001 | Ho et al. | 438/687 |
| 6,207,570 B1 * | 3/2001 | Mucha | 438/692 |
| 6,225,223 B1 * | 5/2001 | Liu et al. | 438/687 |
| 6,258,711 B1 * | 7/2001 | Laursen | 438/633 |

\* cited by examiner

Primary Examiner—Tuan H. Nguyen
(74) Attorney, Agent, or Firm—George O. Saile; Rosemary L. S. Pike

(57) ABSTRACT

A new method of copper damascene metallization utilizing an additional oxide layer between the nitride and the barrier layers to prevent dishing of the copper line after CMP is described. An insulating layer is provided covering semiconductor device structures in and on a semiconductor substrate. A polish stop layer is deposited overlying the insulating layer. An oxide layer is deposited overlying the polish stop layer. An opening is etched through the oxide layer, the polish stop layer, and the insulating layer to one of the semiconductor device structures. A barrier metal layer is deposited over the surface of the oxide layer and within the opening. A copper layer is deposited over the surface of the barrier metal layer. The copper layer and the barrier metal layer not within the opening are polished away wherein the barrier metal layer polishes more slowly than the copper layer whereby dishing of the copper layer occurs. Thereafter, the oxide layer is polished away stopping at the polish stop layer wherein the oxide layer polishes more quickly than the copper layer whereby the dishing of the copper layer is removed and whereby a hump is formed on the copper layer after the oxide layer is completely polished away. The copper layer is overpolished to remove the hump to complete copper damascene metallization in the fabrication of an integrated circuit.

29 Claims, 3 Drawing Sheets

METHOD TO PREVENT CU DISHING DURING DAMASCENE FORMATION

BACKGROUND OF THE INVENTION (1) Field of the Invention

The invention relates to a method of metallization in the fabrication of integrated circuits, and more particularly, to a method of preventing dishing during copper damascene formation in the manufacture of integrated circuits.

(2) Description of the Prior Art

Currently, the copper damascene formation process makes use of three chemical mechanical polish (CMP) steps with different slurries. These steps are the bulk copper CMP step, barrier removal step, and buffing step. This existing process is complex and dishing of the copper line usually occurs during the barrier removal step. The barrier is usually tantalum nitride (TaN) which is much harder than the copper and chemically very stable. The dishing in the copper line will have an impact on the metallization resistance that causes RC delay to vary.

Co-pending U.S. patent application Ser. No. 09/893,080 to W. X. Bin et al filed on Jun. 28, 2001 discloses a SiN capping layer over oxide for protection of the oxide layer during copper or tungsten CMP. U.S. Pat. No. 6,071,809 to Zhao teaches a SiN/SiO$_2$ dual hard mask layer as a polish stop layer for copper CMP. U.S. Pat. No. 6,001,730 to Farkas et al discloses a two-step CMP of copper with a TaN barrier layer. Co-pending U.S. patent application Ser. No. 09/425,310 to F. Chen et al, filed on Oct. 25, 1999 discloses a sacrificial high polishing rate layer over an oxide layer and under a barrier layer and tungsten layer in order to prevent dishing during CMP. Co-pending U.S. patent application Ser. No. 09/110,419 to Sudipto R. Roy filed on Jul. 6, 1998 discloses a sacrificial or semi-sacrificial titanium nitride layer deposited over the oxide to protect the oxide and to act as an endpoint detector. Polishing rates of the tungsten and the titanium nitride are comparable, resulting in dishing. U.S. Pat. No. 5,578,523 to Fiordalice et al teaches the use of a polish assisting layer over a dielectric layer and under a metal layer deposited within a trench. The polish assisting layer and the metal layer are polished at close to the same rate in the final stages of polishing, thus preventing dishing. U.S. Pat. No. 5,798,302 to Hudson et al teaches a low friction layer under a metal layer wherein the polishing rate of the low friction layer is much lower than that of the metal layer causing the CMP process to stop at the top surface of the low friction layer. U.S. Pat. No. 5,886,410 to Chiang et al discloses a hard mask over a polymer through which a trench is etched and filled with tungsten. The tungsten is polished with a higher selectivity to tungsten than to the underlying hard mask. U.S. Pat. No. 5,854,140 to Jaso et al teaches a metal stop layer under an aluminum trench filling layer. The aluminum is polished to the stop layer, resulting in dishing. Then the stop layer is removed with a very high selectivity to the stop layer over the aluminum layer so that the resulting aluminum is substantially planar. U.S. Pat. No. 5,776,833 to Chen et al teaches a titanium nitride layer under a tungsten plug layer. CMP stops at the titanium nitride layer. The titanium nitride layer is then removes by etching rather than by polishing resulting in a protruding tungsten plug. U.S. Pat. No. 5,356,513 to Burke et al discloses alternating layers of soft polishing material and hard polish stops to provide tungsten plugs having a substantially planar surface. U.S. Pat. No. 6,100,197 to Hasegawa et al teaches a copper CMP process. U.S. Pat. No. 6,048,796 to Wang et al discloses a silicon nitride layer over oxide for prevention of particles penetration into the oxide layer during CMP. U.S. Pat. No. 6,096,632 to Drynan teaches a tungsten CMP process.

SUMMARY OF THE INVENTION

A principal object of the present invention is to provide an effective and very manufacturable method of plug metallization including CMP.

Another object of the invention is to provide a method of copper damascene metallization including CMP.

Yet another object is to provide a method of copper damascene metallization in which copper dishing is prevented.

Yet another object is to provide a method of copper damascene metallization in which fewer CMP steps are required.

A still further object of the invention is to provide a method of copper damascene metallization utilizing an additional oxide layer between the nitride and the barrier layers to prevent dishing of the copper line.

In accordance with the objects of this invention a new method of copper damascene metallization utilizing an additional oxide layer between the nitride and the barrier layers to prevent dishing of the copper line after CMP is achieved. An insulating layer is provided covering semiconductor device structures in and on a semiconductor substrate. A polish stop layer is deposited overlying the insulating layer. An oxide layer is deposited overlying the polish stop layer. An opening is etched through the oxide layer, the polish stop layer, and the insulating layer to one of the semiconductor device structures. A barrier metal layer is deposited over the surface of the oxide layer and within the opening. A copper layer is deposited over the surface of the barrier metal layer. The copper layer and the barrier metal layer not within the opening are polished away wherein the barrier metal layer polishes more slowly than the copper layer whereby dishing of the copper layer occurs. Thereafter, the oxide layer is polished away stopping at the polish stop layer wherein the oxide layer polishes more quickly than the copper layer whereby the dishing of the copper layer is removed and whereby a hump is formed on the copper layer after the oxide layer is completely polished away. The copper layer is overpolished to remove the hump to complete copper damascene metallization in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

The process of the present invention will be described with reference to the figures which illustrate a single copper damascene connection line. It will be understood by those skilled in the art that the process of the invention may be extended to a dual damascene copper connection line and to any level of interconnection without departing from the spirit and scope of the present invention.

Figure 1:
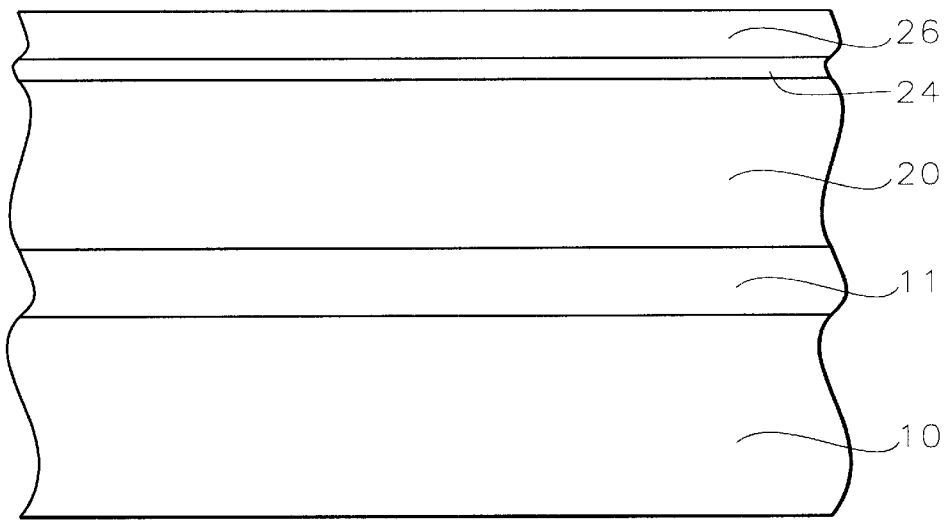
FIGS. 1 through 6 schematically illustrate in cross-sectional representation a preferred embodiment of the present invention.

Referring now more particularly to FIG. 1, there is illustrated a portion of a partially completed integrated circuit. There is shown a semiconductor substrate 10, preferably composed of monocrystalline silicon. Semiconductor device structures, not shown, are formed in and on the semiconductor substrate within the area labeled 11 as is conventional in the art and are covered by a thick insulating layer 20. Semiconductor devices may include transistor gates and associated source and drain regions and lower levels of metallization. For example, a lower level copper line may have been formed within the layer 11. The planned copper damascene line may be formed to contact this underlying copper line. The insulating layer 20 is typically an oxide, such as silicon dioxide, tetraethoxysilane (TEOS) oxide, borophosphosilicate glass (BPSG), or a low dielectric constant material, or the like.

A silicon nitride layer 24 is deposited overlying the oxide layer to a thickness of between about 800 and 1500 Angstroms. Any other material that could be used as a polishing stop may be substituted for the silicon nitride. A silicon dioxide layer 26 is deposited overlying the silicon nitride layer 24 to a thickness of between about 1500 and 2500 Angstroms.

Figure 2:
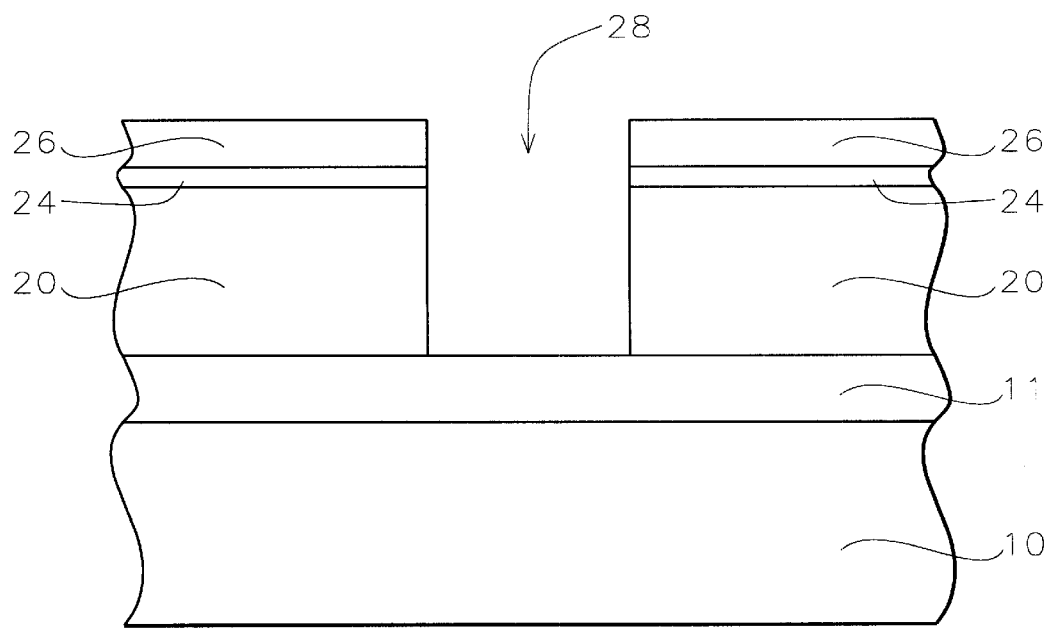

A contact, via, or trench 28 is etched through the bilayer 24/26 and the insulating layer 20, as shown in FIG. 2. Typically, the contact or via will be opened to an underlying semiconductor device structure such as a gate electrode, source/drain region, or metal line. The underlying device structure is not shown in the figures. The trench 30 forms the damascene opening of the invention. It will be understood that this could be a dual damascene opening as well as the single damascene opening illustrated.

Figure 3:
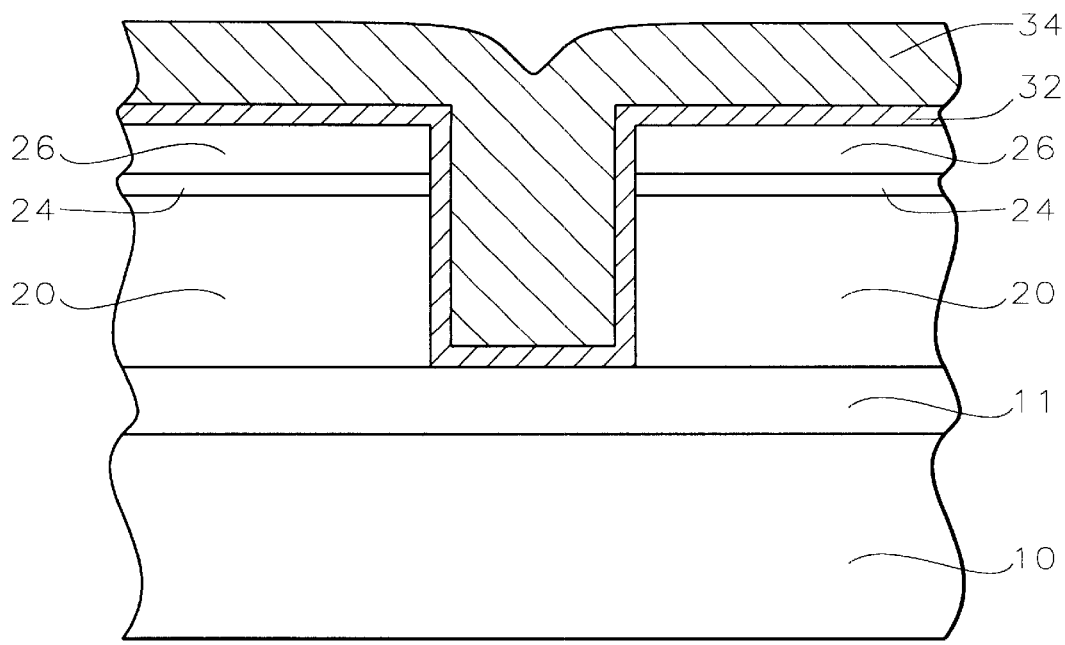

Referring now to FIG. 3, a barrier layer 32 is deposited over the surface of the silicon dioxide layer 26 and within the damascene opening 30. Typically, the barrier layer will comprise a tantalum nitride (TaN) layer deposited by physical vapor deposition (PVD), for example, to a thickness of between about 800 to 2000 Angstroms. Other materials such as titanium nitride may be used.

Copper 34 is formed within the damascene opening. The copper layer may be deposited by chemical or physical vapor deposition, or a seed layer may be deposited followed by electrochemical plating, or it may be deposited by electroless plating, and so on.

Figure 4:
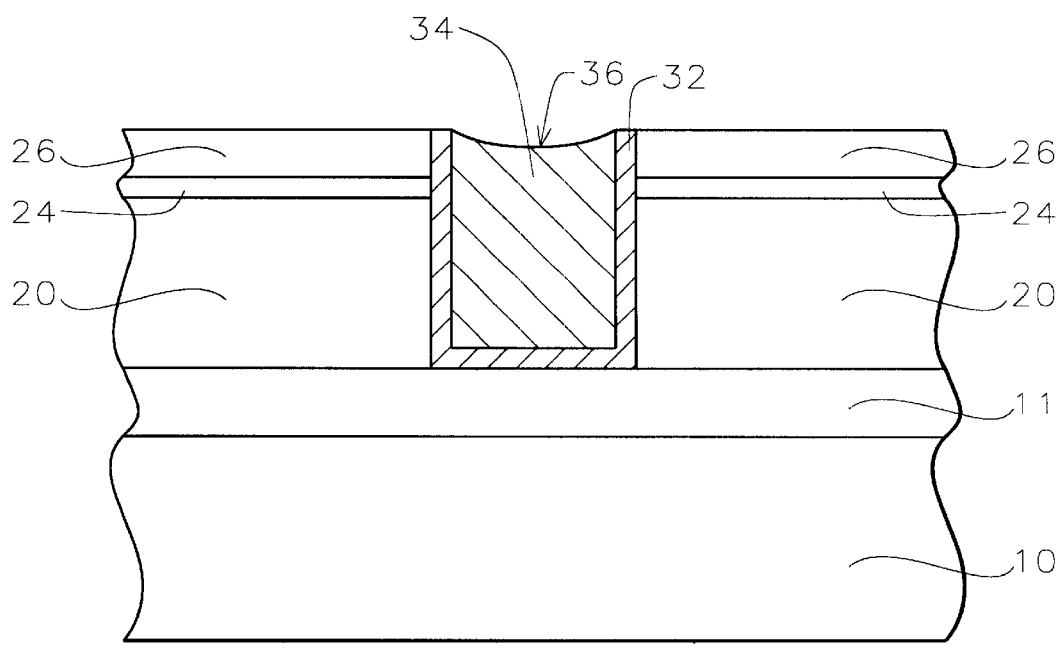

Referring now to FIG. 4, the bulk copper outside of the damascene opening is removed using a chemical mechanical polishing (CMP) process with a copper slurry. When the CMP pad reaches the TaN layer, the TaN will be polished much more slowly than will the copper layer. TaN is much harder and more chemically inert than the copper material. Copper dishing 36 will occur when the TaN layer is completely removed.

Figure 5:
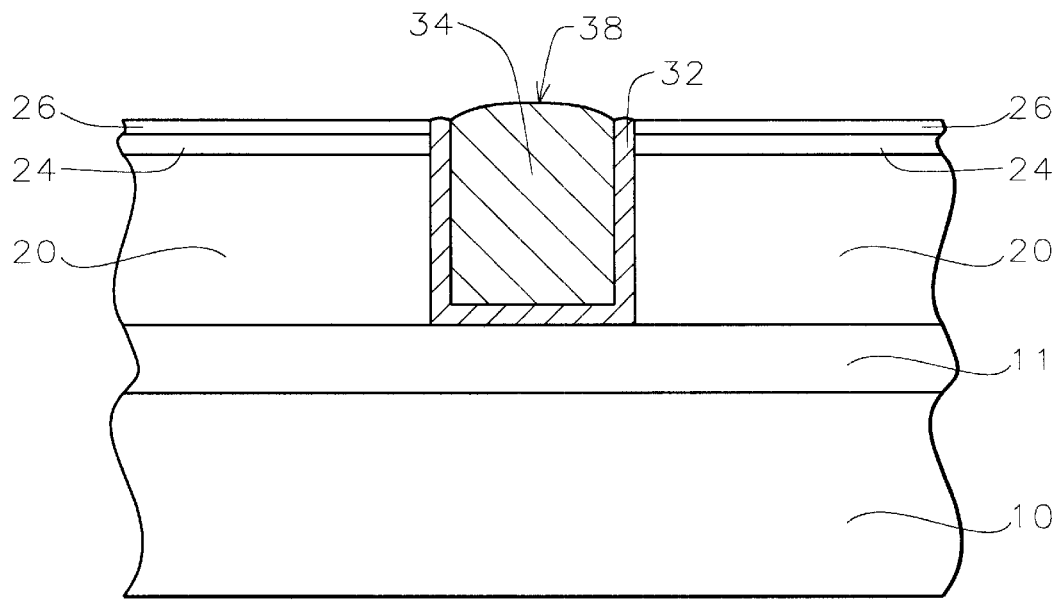

After the TaN barrier layer is completely removed outside of the damascene opening, the CMP slurry is changed to an oxide slurry and the CMP process is continued. Since the oxide removal rate with the oxide slurry is much higher than the copper removal rate, a hump 38 will develop across the copper line, as shown in FIG. 5.

Figure 6:
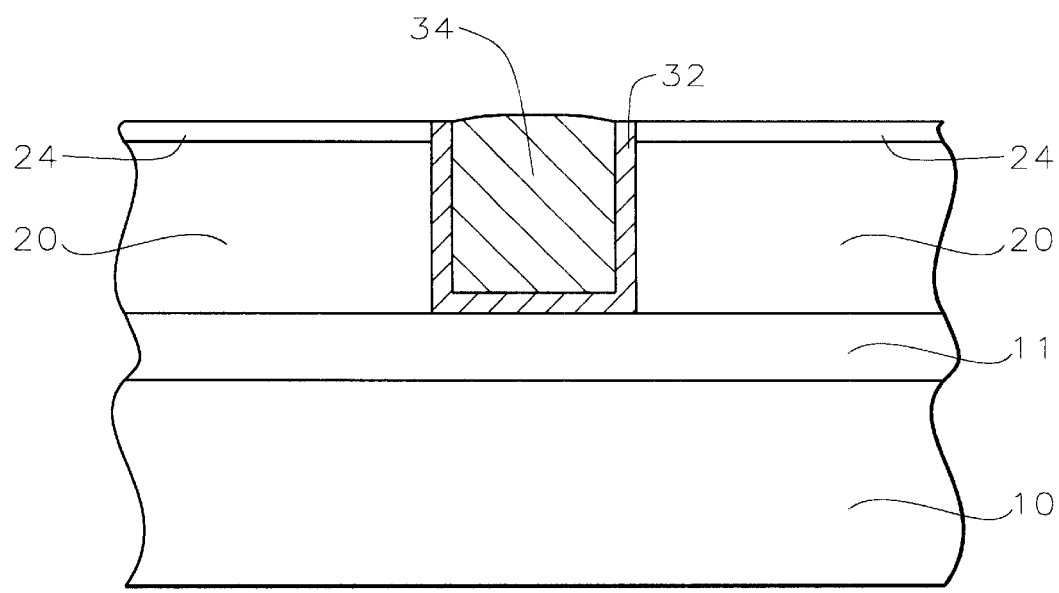

CMP continues until all of the silicon dioxide layer 26 has been removed and the silicon nitride layer 24 has been reached. The silicon nitride layer serves as the CMP polish stop layer and also acts as a barrier to prevent slurry contamination of the dielectric layer 20. This is especially important if layer 20 comprises a low dielectric constant material. A slight CMP overpolish will flatten the copper hump 38, as shown in FIG. 6.

The process of the present invention requires only two CMP steps using two different slurries. Prior art processes require three steps and three different slurries. In the process of the present invention, the copper slurry is used to polish away both the excess copper and the barrier metal layer. The dishing that occurs is removed by the subsequent oxide slurry polishing to remove the additional oxide layer. The humping effect which results from this polishing cushions the dishing effect of the copper polishing, resulting in no dishing of the copper lines at the end of the polishing process.

Other processes may now be performed such as an intermetal dielectric deposition and further metallization, as is well known in the art. The silicon nitride layer 26 remains to provide further protection and prevent contamination of the dielectric layer 20.

The process of the present invention includes the use of an additional oxide layer between the silicon nitride polish stop layer and the barrier metal layer. The invention makes use of the humping effect to cushion the dishing effect, resulting in no dishing of the copper lines at the end of the polishing process.

While the invention has been particularly shown and described with reference to the preferred embodiments thereof, it will be understood by those skilled in the art that various changes in form and details may be made without departing from the spirit and scope of the invention.

What is claimed is:

1. A method of forming copper damascene metallization in the fabrication of integrated circuits comprising:
   providing semiconductor device structures in and on a semiconductor substrate;
   providing an insulating layer covering said semiconductor device structures;
   depositing a polish stop layer overlying said insulating layer;
   depositing an oxide layer overlying said polish stop layer;
   etching an opening through said oxide layer, said polish stop layer, and said insulating layer to one of said semiconductor device structures;
   depositing a barrier metal layer over the surface of said oxide layer and within said opening;
   depositing a copper layer over the surface of said barrier metal layer;
   polishing away said copper layer and said barrier metal layer not within said opening wherein said barrier metal layer polishes more slowly than said copper layer whereby dishing of said copper layer occurs;
   thereafter polishing away said oxide layer stopping at said polish stop layer wherein said oxide layer polishes more quickly than said copper layer whereby said dishing of said copper layer is removed and whereby a hump is formed on said copper layer after said oxide layer is completely polished away; and
   overpolishing said copper layer to remove said hump to complete said copper damascene metallization in said fabrication of said integrated circuit.

2. The method according to claim 1 wherein said semiconductor device structures include gate electrodes and source and drain regions and overlying metal lines and wherein said one of said semiconductor device structure to be contacted is one of said metal lines.

3. The method according to claim 1 wherein said insulating layer comprises tetraethoxysilane (TEOS) oxide.

4. The method according to claim 1 wherein said insulating layer comprises silicon oxide.

5. The method according to claim 1 wherein said polish stop layer comprises silicon nitride having a thickness of between about 800 and 1500 Angstroms.

6. The method according to claim 1 wherein said oxide layer comprises silicon dioxide having a thickness of between about 1500 and 2500 Angstroms.

7. The method according to claim 1 wherein said barrier metal layer comprises one of the group containing tantalum nitride and titanium nitride having a thickness of between about 800 and 2000 Angstroms.

8. The method according to claim 1 wherein said copper layer is deposited by forming a copper seed layer and electroplating to form said copper layer.

9. The method according to claim 1 wherein said step of polishing away said copper layer and said barrier metal layer comprises chemical mechanical polishing using a copper slurry.

10. The method according to claim 1 wherein said step of polishing away said oxide layer comprises chemical mechanical polishing using an oxide slurry.

11. The method according to claim 1 wherein said step of overpolishing comprises chemical mechanical polishing using an oxide slurry.

12. A method of forming copper damascene metallization in the fabrication of integrated circuits comprising:

providing semiconductor device structures in and on a semiconductor substrate;

providing an insulating layer covering said semiconductor device structures;

depositing a silicon nitride overlying said insulating layer;

depositing a silicon dioxide layer overlying said silicon nitride layer;

etching an opening through said silicon dioxide layer, said silicon nitride layer, and said insulating layer to one of said semiconductor device structures;

depositing a barrier metal layer over the surface of said silicon dioxide layer and within said opening;

depositing a copper layer over the surface of said barrier metal layer;

polishing away said copper layer and said barrier metal layer not within said opening wherein said barrier metal layer polishes more slowly than said copper layer whereby dishing of said copper layer occurs;

thereafter polishing away said silicon dioxide layer with a polish stop at said silicon nitride layer wherein said silicon dioxide layer polishes more quickly than said copper layer whereby said dishing of said copper layer is removed and whereby a hump is formed on said copper layer after said silicon dioxide layer is completed polished away; and overpolishing said copper layer to remove said hump to complete said copper damascene metallization in said fabrication of said integrated circuit.

13. The method according to claim 12 wherein said semiconductor device structures include gate electrodes and source and drain regions and overlying metal lines and wherein said one of said semiconductor device structure to be contacted is one of said metal lines.

14. The method according to claim 12 wherein said insulating layer comprises tetraethoxysilane (TEOS) oxide.

15. The method according to claim 12 wherein said insulating layer comprises silicon oxide.

16. The method according to claim 12 wherein said silicon nitride has a thickness of between about 800 and 1500 Angstroms.

17. The method according to claim 12 wherein said silicon dioxide layer has a thickness of between about 1500 and 2500 Angstroms.

18. The method according to claim 12 wherein said barrier metal layer comprises one of the group containing tantalum nitride and titanium nitride having a thickness of between about 800 and 2000 Angstroms.

19. The method according to claim 12 wherein said copper layer is deposited by forming a copper seed layer and electroplating to form said copper layer.

20. The method according to claim 12 wherein said step of polishing away said copper layer and said barrier metal layer comprises chemical mechanical polishing using a copper slurry.

21. The method according to claim 12 wherein said step of polishing away said silicon dioxide layer comprises chemical mechanical polishing using an oxide slurry.

22. The method according to claim 12 wherein said step of overpolishing comprises chemical mechanical polishing using an oxide slurry.

23. A method of forming copper damascene metallization in the fabrication of integrated circuits comprising:

providing semiconductor device structures in and on a semiconductor substrate;

providing an insulating layer covering said semiconductor device structures;

depositing a silicon nitride overlying said insulating layer;

depositing a silicon dioxide layer overlying said silicon nitride layer;

etching an opening through said silicon dioxide layer, said silicon nitride layer, and said insulating layer to one of said semiconductor device structures;

depositing a barrier metal layer over the surface of said silicon dioxide layer and within said opening;

depositing a copper layer over the surface of said barrier metal layer;

chemical mechanical polishing away said copper layer and said barrier metal layer not within said opening using a copper slurry wherein said barrier metal layer polishes more slowly than said copper layer whereby dishing of said copper layer occurs;

thereafter chemical mechanical polishing away said silicon dioxide layer using an oxide slurry with a polish stop at said silicon nitride layer wherein said silicon dioxide layer polishes more quickly than said copper layer whereby said dishing of said copper layer is removed and whereby a hump is formed on said copper layer after said silicon dioxide layer is completely polished away; and overpolishing said copper layer using said oxide slurry to remove said hump to complete said copper damascene metallization in said fabrication of said integrated circuit.

24. The method according to claim 23 wherein said semiconductor device structures include gate electrodes and source and drain regions and overlying metal lines and wherein said one of said semiconductor device structure to be contacted is one of said metal lines.

25. The method according to claim 23 wherein said insulating layer comprises tetraethoxysilane (TEOS) oxide.

26. The method according to claim 23 wherein said silicon nitride has a thickness of between about 800 and 1500 Angstroms.

27. The method according to claim 23 wherein said silicon dioxide layer has a thickness of between about 1500 and 2500 Angstroms.

28. The method according to claim 23 wherein said barrier metal layer comprises one of the group containing tantalum nitride and titanium nitride having a thickness of between about 800 and 2000 Angstroms.

29. The method according to claim 23 wherein said copper layer is deposited by forming a copper seed layer and electroplating to form said copper layer.

* * * * *